United States Patent [19]

Clark et al.

[11] 4,068,181

[45] Jan. 10, 1978

[54] DIGITAL PHASE COMPARATOR

[75] Inventors: Michael A. G. Clark; Michael J. Underhill, both of Crawley, England

[73] Assignee: U.S. Philips Corporation, New York, N.Y.

[21] Appl. No.: 731,337

[22] Filed: Oct. 12, 1976

[30] Foreign Application Priority Data

Oct. 14, 1975 United Kingdom ............... 42033/75

[51] Int. Cl.² .............................................. H03B 3/04
[52] U.S. Cl. ..................................... 328/133; 328/151
[58] Field of Search .............. 328/133, 151; 324/83 D

[56] References Cited

U.S. PATENT DOCUMENTS

| 3,519,929 | 7/1970 | Ault | 328/133 X |
| 3,621,224 | 11/1971 | Friday | 328/151 X |
| 3,688,211 | 8/1972 | Calaway | 328/133 X |
| 3,795,169 | 3/1974 | Belcher | 324/83 D |

Primary Examiner—John S. Heyman
Attorney, Agent, or Firm—Frank R. Trifari; Henry I. Steckler

[57] ABSTRACT

A high gain digital phase comparator which in digital phase lock loop systems can give a thousand-fold reduction in ripple and close-in noise sideband amplitudes. The comparator is of the sample-and-hold type but the normal ramp reference waveform is replaced by a trapezoidal waveform with a very steep rising or falling slope generated by a trapezoidal waveform generator. This slope is sampled by a sampling circuit coupled to said generator and its steepness gives the increased gain of the phase comparator leading to the reduced noise and ripple. Additional logic and switching circuits are added to make the comparator operate only during a rising edge of the trapezoidal waveform.

5 Claims, 11 Drawing Figures

DIGITAL PHASE COMPARATOR

This invention relates to digital phase comparators.

Phase comparators are used in various systems where a signal indicative of the phase difference (leading or lagging) between two input signal frequencies is required; for example in frequency measurement systems having a high accuracy and in phase lock loops (P.L.L.'s).

In addition to the output signal indicative of the phase difference, spurious signals (usually referred to as noise, or feed-through) appear on the output. This noise contains components of the input signals and steps have to be taken to reduce this noise as much as possible — for example by filtering. The effects of such noise will now be discussed with reference to a particular application of a digital phase comparator; namely in a P.L.L. used in a frequency synthesiser.

Figure 1:
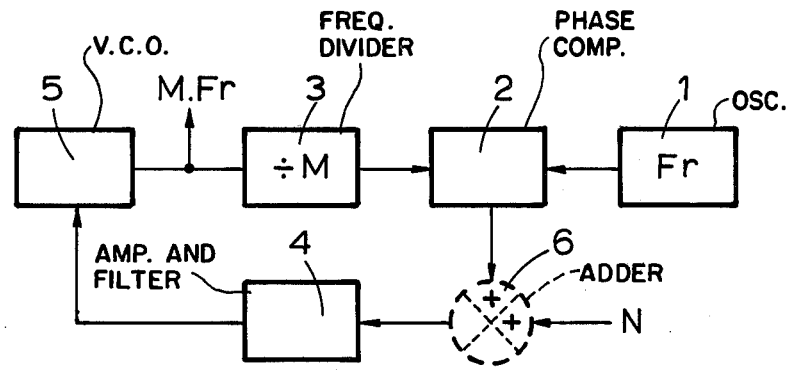

FIG. 1 of the accompanying drawings shows a typical known frequency synthesiser using a single P.L.L. in which the output frequency is M times a reference frequency $Fr$ derived from a reference source 1 such as a crystal-controlled oscillator. The output of source 1 is fed to one input of a phase comparator 2 and the output of a $\div$ M frequency divider 3 is fed to the other input of the frequency comparator. The output of the phase comparator 2 is fed to a loop amplifier and filter unit 4 the output of which controls the frequency of a V.C.O. 5. The output of the V.C.O. forms the synthesizer output and is also fed to the input of divider 3. If the amplifier and comparator phase noise N is assumed to be injected into the system via an adder 6, shown in broken outline, the phase noise $\Delta\phi$ out at the synthesiser output is approximately given, at frequencies below loop cut-off, by $$\Delta\phi \text{ out} = N \times M/K\phi$$

where $K\phi$ is the gain of the comparator in volts per cycle. In many applications, the reference frequency is in the order of 10kHz and the output frequency is in the 10's or 100's of MHz range. Thus M is generally very large and the phase noise is very high. A typical phase comparator has a low gain, e.g. 5v/cycle, and the resultant noise causes predominant close-in noise sidebands. To mitigate this problem, designers have previously used a very narrow bandwidth loop and have relied on the V.C.O. to give the required spectral purity, or have chosen a multiple-loop solution to reduce M. Multiple loop systems suffer complexity and, in some cases, use several reference oscillators. An example of a multiple loop frequency synthesiser is given in "Frequency synthesiser RY746 for HF receivers and transmitters," P. Bikker, Philips Telecommunication Review Vol 30 No. 3, August 1972 and an example of a multi-oscillator synthesiser is given in RCA digital Integrated Circuits Application Note ICAN-6716 page 610.

A P.L.L. is known, for example from U.S. Pat. No. 3,174,090 in which the phase comparator comprises a narrow range high gain comparator and a wide range low gain comparator in parallel. When the two input signals to the comparator have a small phase difference, i.e. in the narrow range, the phase comparator has a high gain $K\phi$ and so the noise $\Delta\phi$ from that comparator is low. This is the normal operating condition since the P.L.L. is locking the phase of the oscillator on to the phase of the reference frequency. When the phase difference is greater than the narrow phase range, e.g. during capture, then the wide range low gain comparator provides the major portion of the output signal. It is to be noted, however, that irrespective of which comparator is providing the phase difference signal, both comparators produce noise in the common output. Thus the inherent advantage of having a high signal-to-noise ratio in the high gain narrow range comparator is largely offset by the noise produced by the low gain wide range comparator.

Other wide range comparators are known which comprise a narrow range (usually 360°) phase comparator and a separate frequency discriminator in order to give wide range coverage. Two separate outputs are provided, that of the phase comparator generally being referred to as the fine control output and that of the frequency discriminator as the coarse control output. The provision of two outputs has various disadvantages. Firstly the equipment controlled by the two outputs, for example a voltage-controlled oscillator (V.C.O.), is complicated due to the fact that it requires two separate input circuits. Secondly, measures are necessary to prevent one control signal from counteracting the effect of the other. Thirdly, noise is generally produced in each output.

A method has been proposed for preventing one control signal from counteracting the effect of the other (U.S. Pat. No. 3,825,855) by using a switching system in a P.L.L. frequency synthesiser circuit which ensures that only one of the two output signals of the fine/course comparator can vary at a time. Whilst the coarse control is operative, the fine control (360°) phase comparator is locked to its central (180°) state by applying complementary signals to its two inputs. Thus the 360° phase comparator still contributes noise to the output signal; particularly so as a high gain comparator is not used.

Another known comparator is of the type having two outputs, i.e. using separate phase and frequency comparators. This comparator again uses a separate switching system by means of which the output of the narrow range (360°) comparator is held at its mid-range point whilst the wider range frequency discriminator is operative. This has the advantage that, in this condition, the output of the phase comparator is substantially free of noise but still suffers from the disadvantages of separate outputs and, since the coarse control output signal has a staircase waveform stepped at the input frequency to the frequency comparator, this frequency is present in the output.

The object of the invention is at least to mitigate all the aforementioned disadvantages by providing a wide range phase comparator which has a single output terminal and which produces very low noise.

According to the present invention, there is provided a digital phase comparator for comparing the phases of first and second binary input signal waveforms, the comparator including a sampling switch operable for a given period by each occurrence of a given edge of the first input waveform, a ramp waveform generator operable on each occurrence of a corresponding given edge of the second input waveform to generate, in synchronism with the second input waveform, a third waveform having a ramped leading edge of predetermined slope occupying less than 180° of the third waveform and having a duration greater than that of the given period, the sampling switch being arranged to sample the value of third waveform on each operation of the switch, and a sample hold circuit which stores the sampled value between sampling instants and provides an analogue signal at the comparator output indicative of the sampled value, the comparator further including a detector which responds, in the event that the sample switch is operated other then during the period of the ramped leading edge, to disconnect the analogue signal from the comparator output and to provide thereat either a second or a third signal according to whether the phase difference between the two input signal waveforms is increasing or decreasing; each of the second and third signals having a respective predetermined constant d.c. level different from that of the other of these two signals.

The advantages of the comparator according to the invention are as follows. Firstly, only one output signal is used, hence avoiding the complexities required in associated apparatus when two outputs are used. Thus there can be considerable circuit simplification in said apparatus. Secondly, by making the ramped leading edge occupy less than 180° of the third waveform, the gain of the comparator over this range can be very considerably increased; so providing a high signal-to-noise ratio and, hence, a very low noise output. Thirdly, on one side of this narrow, high gain, range the output is switched to a first constant output level and, on the other side, is switched to a different constant output level. Thus no noise is generated by the comparator when the phase error between the two input signals exceeds the narrow range in either direction. Fourthly, the two constant output levels, being different, provide an unambiguous indication of whether the phase difference between the two input signals is increasing or decreasing.

The said given edge of each input signal waveform is preferably the leading edge thereof. In some applications, the pulse width of incoming pulses tends to vary slightly whereas the leading edges are usually recurrent at precisely-defined intervals. Thus the use of the trailing edges of such pulses could give rise to system jitter whereas the use of the leading edge eliminates the possibility of such jitter.

Preferably, the d.c. output levels of the second and third signals coincide with the respective end limit levels of the output signal range provided by the comparator whilst the sampling switch is operated during the period of the ramped leading edge. By this means, the output characteristic of the phase comparator is continuous over its whole range.

Embodiments of the invention will now be described, by way of example, with reference to FIGS. 2 to 11 of the accompanying drawings, of which:

FIG. 1 shows a typical prior art frequency synthesizer.

Figure 2:
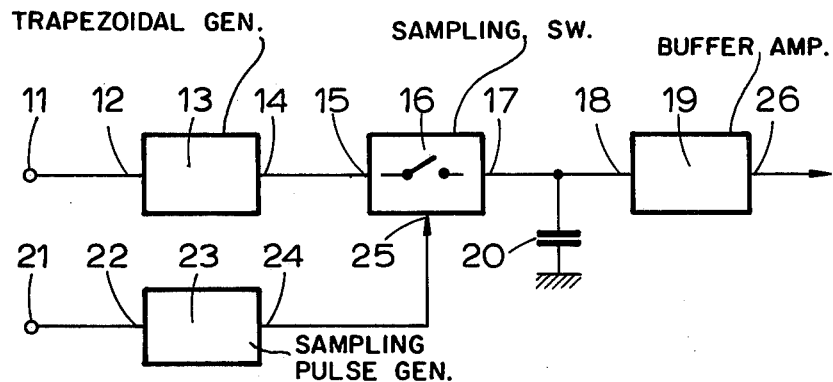
Figure 5:
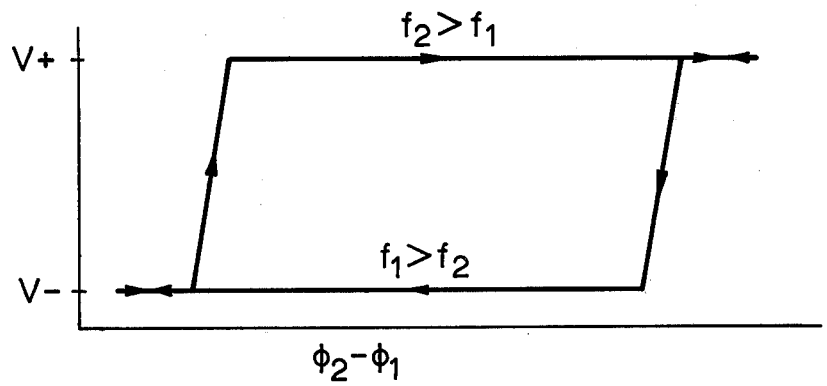
Figure 3:
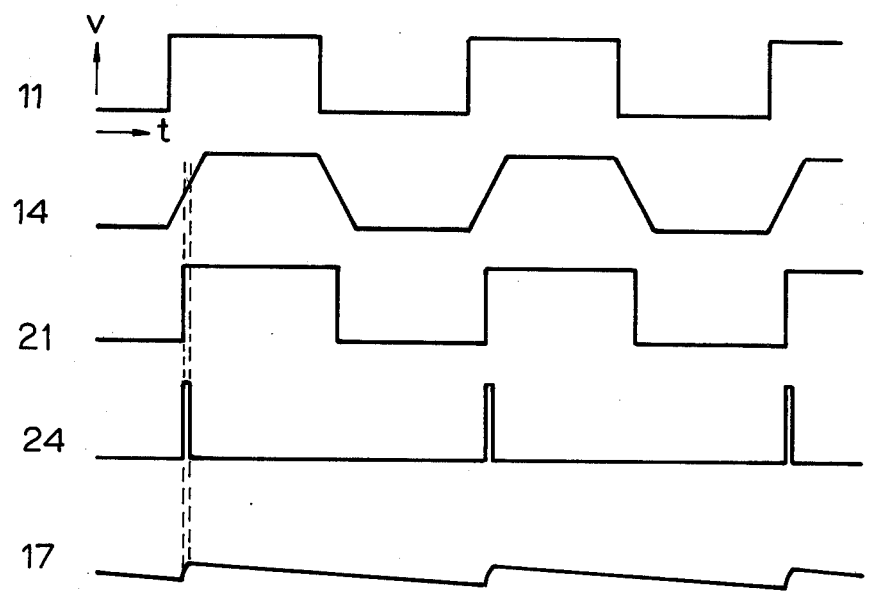
Figure 4:
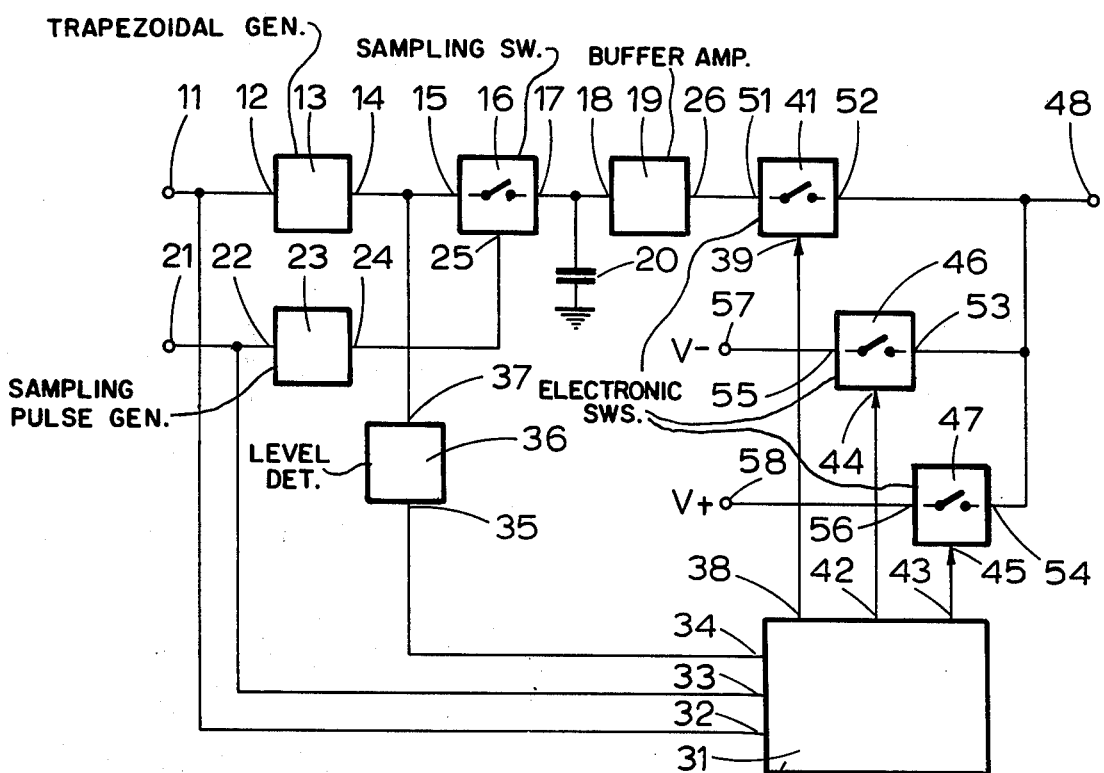
Figure 6:
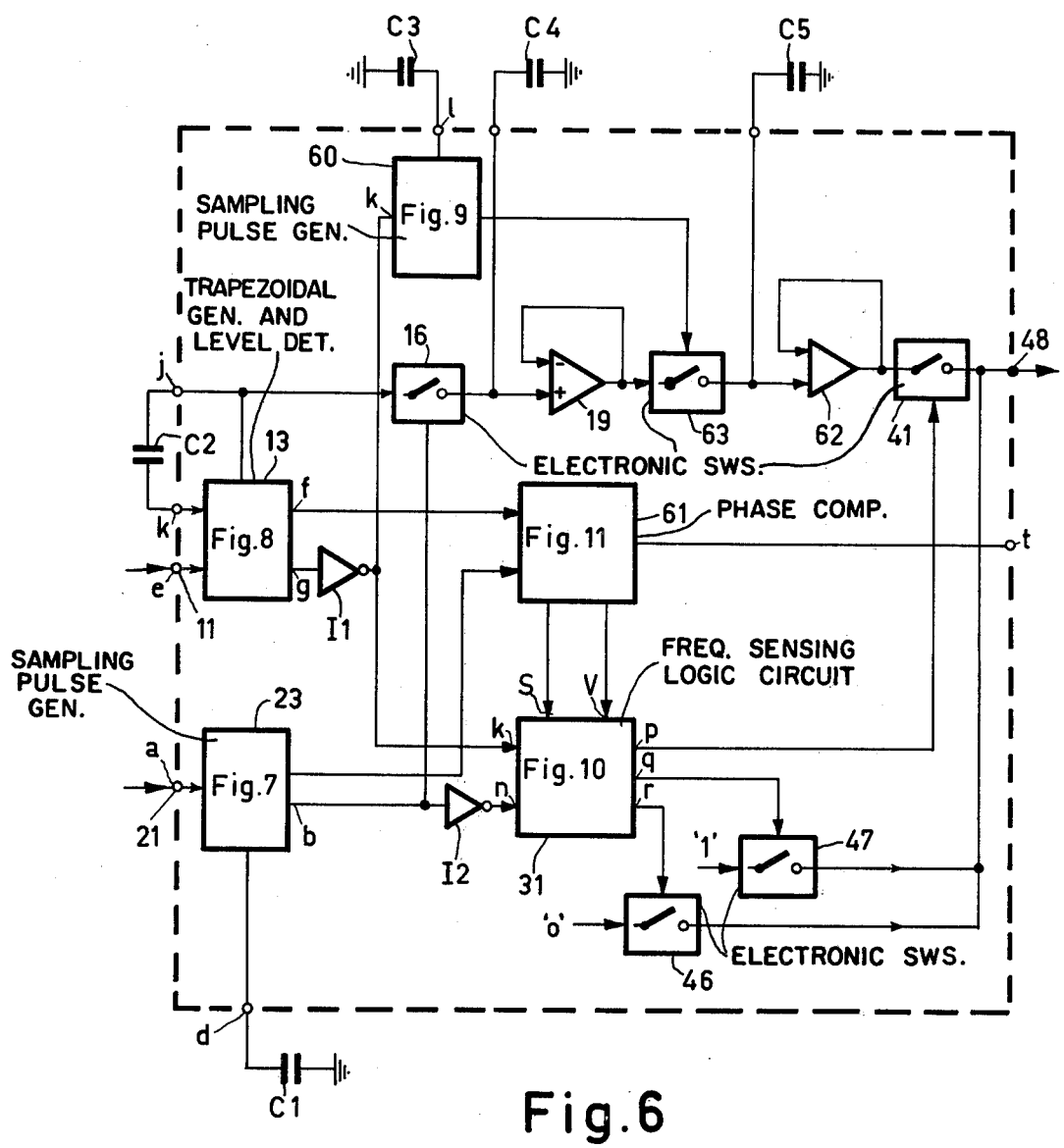

FIG. 2 shows a block schematic circuit diagram of part of a phase comparator according to the invention, showing the basic principle thereof, FIG. 3 shows typical waveforms occurring in the operation of the comparator shown in FIG. 2, FIG. 4 shows a block schematic circuit diagram of a second embodiment of a phase comparator according to the invention, FIG. 5 shows the phase/voltage characteristic of the embodiment shown in FIG. 4, FIG. 6 shows a block schematic diagram of a preferred embodiment of the phase comparator, FIGS. 7 to 11 show circuit diagrams of circuit blocks given in FIG. 6.

Referring now to FIG. 2, an input 11, for the first of the two binary signal waveforms to be compared with respect to phase, is connected to the input 12 of a trapezoidal waveform generator 13 having an output 14 connected to input 15 of a sampling switch 16. The output 17 of switch 16 is connected to the input 18 of a unity gain buffer amplifier 19 and also to a storage capacitor 20. An input 21, for the second of the two binary signal waveforms, is connected to input 22 of a sampling pulse generator 23 the output 24 of which is connected to the control input 25 of switch 16. The output 26 of amplifier 18 constitutes the comparator output.

The operation of the comparator shown in FIG. 2 will now be described with reference to typical waveforms which may occur therein and which are shown in FIG. 3. Each waveform is given the reference numeral of the circuit point in FIG. 2 at which it appears. Input voltage waveforms to the comparator will typically be as shown at 11 and 21, in FIG. 3, after being shaped if necessary. Generator 13 generates waveform 14 in synchronism with at least the rising edge of waveform 11. Pulse generator 23 produces the pulses shown in waveform 24, the leading edge of each pulse being synchronous with the rising edge of the corresponding waveform 21. Each pulse is of a given duration (e.g. 20nS) less than the duration (e.g. 100nS) of the rising edge of waveform 14, which edge preferably has a constant slope.

If the two input signals are at the same frequency, for the time that the phase relationship is such that the pulses in pulse train 24 occur during the corresponding rising edges of the trapezoidal waveform 14, the average voltage on the hold capacitor 20 will be proportional to the voltage of the rising edge at the sampling instant. As buffer amplifier 19 has a finite input impedance, and capacitor 20 has some leakage, this voltage will decay between samples. In addition, the sampling switch has a parasitic series resistance (not shown in FIG. 2) and the trapezoidal waveform generator 13 has finite output impedance; hence the capacitor will take a certain time to charge up. The waveform 17 shows these features.

The gain of the phase comparator under these conditions is proportional to the steepness of the rising edge slope of the trapezoidal waveform and can therefore be made very high. Thus although the ripple shown in waveform 17 can be regarded as noise, the higher gain of the comparator according to the invention will result in this ripple modulating carrier wave, for example, to a lesser degree as indicated by the above equation.

If the repetition rate of the input waveforms is 10kHz and each has a peak-to-peak amplitude of 10V and a rise time of the trapezoidal waveform of 100nS, the gain of the comparator when sampling a rising edge is $10^4$ volts/cycle. At the same repetition rate and peak-to-peak amplitude, the gain of a conventional phase comparator which operates linearly over a 360° phase difference range is 10 volts/cycle. In this example an increase in gain of 1000 times has been achieved.

The comparator so far described with reference to FIGS. 2 and 3 is not sensitive to large frequency differences between the two input signals. In most practical P.L.L. situations, it will be necessary to make the circuit sensitive to frequency in order to achieve phase lock. A block schematic circuit diagram of an embodiment providing this facility is shown in FIG. 4, in which circuit points and blocks corresponding to those of FIG. 2 are given the same reference numerals.

In FIG. 4, a frequency sensing logic circuit 31 has two inputs 32, 33 to which comparator inputs 11 and 21 are respectively connected and a third input 34 to which the output 35 of a level detector 36 is connected. The input 37 of detector 36 is connected to output 14 of trapezoidal waveform generator 13. An output 38 of logic circuit 31 is connected to the control input 39 of an electronic switch 41. Further outputs 42, 43 of logic circuit 31 are respectively connected to control inputs 44, 45 of two further electronic switches 46, 47. Output 26 of buffer amplifier 19 is connected to output 48 of the comparator via input 51 and output 52 of switch 41. Outputs 53 and 54 of switches 46, 47 are each connected to the comparator output 48 and inputs 55, 56 of these switches one connected to terminals 57, 58 respectively. In the example given, a negative potential $-V$ (e.g. representing logic "0" level) is connected to terminal 57 and a positive potential $V+$ (e.g. representing logic "1" level) is connected to terminal 58.

The circuit operation of blocks 13, 16, 19, 20 and 23 in FIG. 4 is the same as that described with reference to FIG. 2. Level detector 36 detects when the voltage at output 14 of the trapezoidal waveform generator 13 reaches its maximum level and provides an output signal at its output 35 to input 34 of logic circuit 31. This signal, together with the input signal waveforms on inputs 32 and 33 provides sufficient information for the logic circuit to detect the condition that the leading edge of the waveform on input 21 arrives during the rise time of the trapezoidal waveform on the output of generator 13. Alternatively, of course, the output 24 of pulse generator 23 could be connected to input 33 of logic circuit 31 to give the instant of arrival of the leading edge of the waveform at input 21. On detecting the above condition, logic circuit 31 provides a signal on its output 38 to operate electronic switch 41 and, hence, to connect the output 26 of buffer amplifier 19 to the output 48 of the comparator. Thus if the two input signal waveforms have the same frequency and have a phase relationship such that the sampling pulse occurs during the rise time of the trapezoidal waveform, then switch 41 is closed and the circuit functions in the manner described with reference to FIG. 2.

Logic circuit 31 also includes a frequency difference detector which operates to provide a signal at its output 42 or 43 respectively, according to whether the frequency of a signal at input 11 is less or greater than the frequency of the signal at input 21. Thus if the repetition rates of the waveforms appearing at inputs 11 and 12 are $f_1$ and $f_2$ respectively, then logic circuit 31 operates switch 46 if $f_1 > f_2$ and operates switch 47 if $f_2 > f_1$. Only one of switches 41, 46 and 47 can be operated at any one time.

As stated previously, the gain of the comparator is a direct function of the steepness of the slope of the trapezoidal waveform. If the slope concerned extends over 180° of the waveform being compared, then only twice the gain is achieved compared with that of the conventional 360° linear comparator. To achieve a useful increase in gain, the ramped leading edge of the phase comparator according to the invention occupies less than 180° of the waveform being compared. Other forms of comparator are known, using generated triangular waveforms, which extend over greater than or equal to 180°.

If, on switching on a P.L.L. using the phase comparator so far described, the sampling pulses occur other than during the rising slope of the trapezoidal waveform, then the "1" or "0" output on terminal 48 causes the voltage-controlled oscillator (V.C.O.) in the P.L.L. to change its frequency in the appropriate direction. If the initial starting conditions are such that none of the switches operates immediately, natural variations in the oscillator frequency assures, in practice, that one of the switches operates within a couple of cycles of the input waveform and the P.L.L. is then driven towards the locked state.

If the charge on capacitor 20 in FIG. 4 can vary between $V+$ and $V-$, then the voltage/phase characteristic of the comparator is as shown in FIG. 5, in which the ordinate is the phase difference $\phi_2 - \phi_1$ between the two input waveforms. As can be seen from this Figure, the output voltage is either $V+$ or $V-$ or is linearly variable therebetween where the phase difference is such that the sampling pulses occur during the rising edge of the trapezoidal waveform.

Obviously, the falling edge of the trapezoidal waveform 14 (FIG. 3) could be used instead of the rising edge in the foregoing embodiment.

FIG. 6 is a block schematic diagram of a practical embodiment of a digital phase comparator according to the invention, which comparator uses a falling slope for sampling, and FIGS. 7 to 11 are circuit diagrams of the circuit blocks given in FIG. 6. In each of FIGS. 6 to 11, lower case letters are used for referencing the various interconnecting leads between circuit components. Items in FIG. 6 which correspond to similar items in FIG. 4 are given the same reference numerals in both Figures. As can be seen, FIG. 6 is generally similar to FIG. 4, the additional major items being a second sampling pulse generator 60, a second phase comparator 61, an additional buffer amplifier 62 and an additional switch 63. In that the comparator can largely be constructed from standard integrated circuit blocks, as will be described later, the whole circuit apart from capacitors C1 to C5 and various resistors can be integrated in monolithic form; this being represented by the enclosing broken line. Capacitor C4 is the equivalent of capacitor 20 in FIG. 4.

The operation of the comparator will now be described with reference to FIGS. 6 to 11. The input signal waveforms to be compared are fed to the comparator via leads $a$ and $e$. Sampling pulse generator 23 of FIG. 6 is shown in detail in FIG. 7 and comprises three two-input NOR gates 64, 65, 66, a resistor R1 and a capacitor C1. NOR gates 64 and 65 have their inputs connected together and thus act as simple inverters. A rising ('0' → '1') edge of an input waveform applied to input lead $a$ produces a falling ('1' → '0') edge on the upper input (as viewed in the Figure) of gate 66 and gate 65 produces a rising ('0' → '1') edge at output lead $c$. The voltage across capacitor C1 is initially at logic level '0' and hence the output of gate 66 goes to '1'. Capacitor C1 immediately starts charging and, after a period dependent upon the value of capacitor C1 and resistor R1 the voltage across it approaches logic '1'. The output of gate 66 thereupon goes to '0'. Thus a pulse is produced on lead $b$ on each occurrence of a rising edge of the input waveform on lead $a$, the duration of this pulse being controlled by the capacitance value of capacitor C1. In practice, a pulse width of a few nanoseconds was used for the sampling pulse. This pulse operates the sampling switch 16 (FIG. 6) to sample the waveform generated by waveform generator 13 (on lead $j$).

The waveform appearing on lead c, synchronous with the waveform on lead a, is fed to the second phase comparator 61 to serve as one input waveform therefore. The output pulse on lead b is inverted by inverter I2 and supplied to the frequency-sensing logic circuit 31 via lead n.

Figure 8:
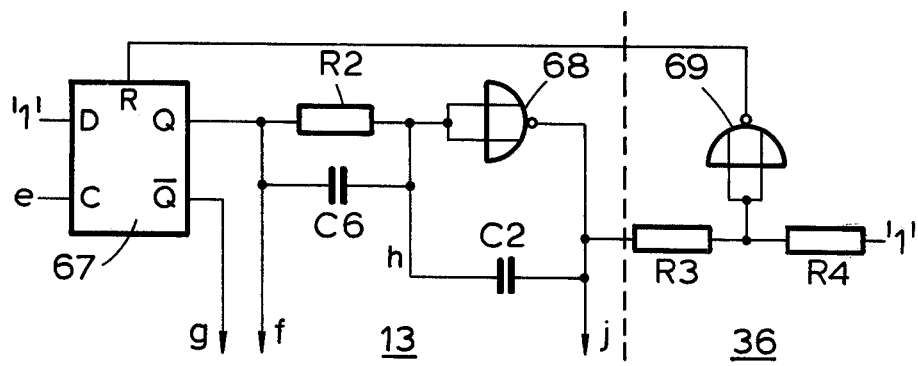
Figure 9:
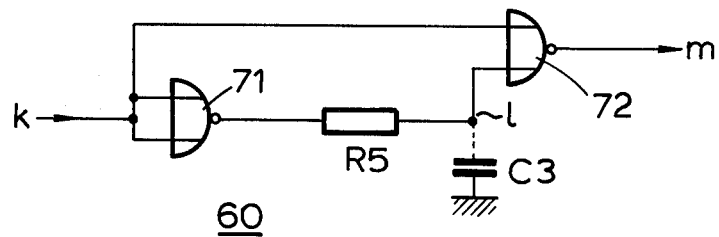

FIG. 8 shows the combined circuit of waveform generator 13 and level detector 36 which circuit comprises a rising-edge-triggered delay flip-flop 67 having a delay input D, a clock input C, a reset input R, and complementary outputs Q and $\overline{Q}$. The Q output is fed, via lead f, to an input of second phase comparator 61 and to an inverter-connected NOR gate 68 via the parallel arrangement of a capacitor C6 and a resistor R2 and lead h. The output of gate 68 is connected to '1' via a voltage divider comprising resistors R3 and R4 the junction point of which is connected to the inputs of an inverter-connected NOR gate 69. The output of gate 69 is connected to the reset input R of flip-flop 67, a '1' being permanently provided on the D input thereof. Resistors R3, R4 and gate 69 constitute the level detector 36 of FIG. 4. It is to be noted in the following description that all device inputs not shown connected in the Figures, e.g. the normal set input; S of flip-flop 67 in FIG. 8, are assumed to be held at '0'. The output lines h and j are connected to a capacitor C2.

If it is assumed that the Q output of flip-flop 67 is initially at '0' this output goes to '1' (the input on D) immediately a rising ('0' → '1') edge of the input waveform on lead e appears at the clock input C. This '1' appearing on lead h at the input of the gate 68, which gate functions as an inverter, drives the gate output on lead j towards '0' at a rate dependent upon the capacitance value of capacitor C2. Up to this point, lead j was at '1' and hence the output of gate 69 was at 0'. The value of resistors R3 and R4 are so proportioned with respect to the switching voltage level of gate 69 that gate 69 switches to provide a 1 output to the reset input R of flip-flop 58 when the falling slope generated by gate 68 and capacitor C2 has reached a predetermined level. In this way, a falling slope of a predetermined duration is generated on output lead j immediately on arrival of the rising edge of the input waveform on lead e. It is this falling slope which is sampled by the sampling pulses generated at each rising edge of the other input waveform (on lead a, FIGS. 6 and 7) and the duration of this slope is considerably greater than that of the sampling pulses. As soon as the '1' from gate 69 appears on reset input R of flip-flop 67, the latter is reset and provides a '0' on the Q output, whereupon capacitor C2 discharges until a point is reached when the output of gate 69 goes to '0' again and removes the reset '1' input to flip-flop 67. Thus the $\overline{Q}$ output of flip flop 67 on lead g goes to '0' and the Q outputs on lead f goes to '1' for the duration of the generated falling slope and provide slope duration information to the second sampling pulse generator 60, to logic circuit 31, and to the second phase comparator 61.

Figure 7:
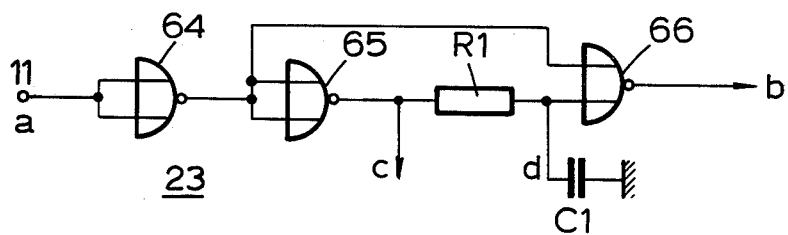

The output on lead j is sampled by switch 16 and fed to buffer amplifier 19 as described with reference to FIG. 4. The output of amplifier 19 is as shown in waveform 17 of FIG. 3 and is fed to the input of a sampling switch 63. This switch is controlled by a second sampling pulse generator 60 (FIGS. 6 and 9) comprising two NOR gates 71, 72, a resistor R5, and a capacitor C3. This pulse generator functions in a similar manner to that of FIG. 7 except that in this case, the equivalent of inverter 64 of FIG. 7 is not provided, with the result that a sampling pulse is provided on receipt of a falling edge of waveform k, i.e. at the end of the falling slope. The sampling pulse on lead m controls switch 63. The width of the sampling pulse is controlled by the values chosen for capacitor C3 and resistor R5. To summarise the foregoing, a first series of sampling pulses coincident with the rising edges of the input waveform on lead a is generated by first sampling pulse generator 23 (FIGS. 6 and 7) and a second series of sampling pulses is generated by second sampling pulse generator 60 (FIGS. 6 and 9) at the end of the falling slopes. This further sampling of the waveform 17 has the effect of reducing the a.c. component (ripple), since the width of the second sampling pulses can be considerably greater than that of the first sampling pulses. Thus more time can be taken to charge integrating capacitor C5 with the result that this capacitor may have a larger capacitance than C4 and the ripple is considerably reduced. In practice, the ripple component can be reduced to a minimum which is limited only by the switching crosstalk from the switch. The signal on capacitor C5 is then passed via buffer amplifier 62 to switch 41.

Figure 10:
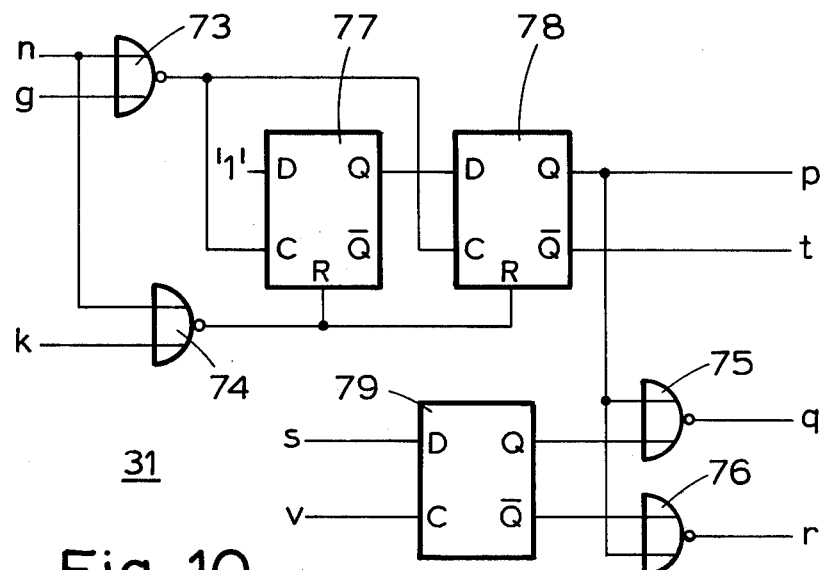

FIG. 10 shows the circuit details of the frequency-sensing logic circuit 31 of FIG. 6 and comprises four NOR gates 73 to 76 and three D-type flip-flops 77 to 79. Due to inverter I2 (FIG. 6), the signal on lead n is a '0' during the '1' sampling pulses on lead b. As explained with reference to FIG. 8, the signal lead f is a '1' and the signal on lead g is a '0' during the falling slope period. Thus if the sampling pulse occurs during this period, a '1' pulse appears on the output of gate 73 in synchronism with the sampling pulse. This causes flip-flops 77 and 78 to set (if not already on the set state) due to the permanent '1' on the D input of flip-flop 85.

The signal on lead k is a '1' during the falling slope period and, hence, gate 74 is inhibited for this period. Sampling pulses ('0' on lead n) occurring during this period are therefore blocked by gate 74. If a sampling pulse occurs at any time other than during the falling slope, gate 74 is enabled and the '1' on its output resets flip-flops 77 and 78 (if not already in the reset state). Thus the signal on lead p is a '1' if sampling takes place during the period of the falling slope and the signal on lead t is a '1' at all other times. Gates 75 and 76 are therefore inhibited if sampling occurs during the period of the falling slope and electronic switches 46 and 47 (FIG. 6) cannot be operated. Electronic switch 41 is operated during this period by the '1' on lead p and the signal sample present on the output of buffer amplifier 62 is fed to output terminal 48. Conversely, if the sampling pulses occur at any other time than during the period of the falling slope, then the '0' on lead p prevents the operation of switch 41 and enables switches 75 and 76 to respond to the Q and $\overline{Q}$ outputs of flip flop 79. The operation of flip flop 79 depends upon the operation of the second phase comparator 61 shown in detail in FIG. 11.

Figure 11:
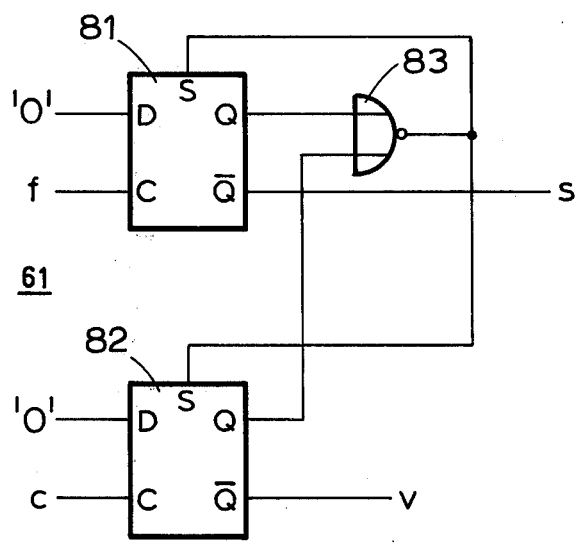

Referring now to FIG. 11, the second phase comparator shown includes a known comparator comprising two flip-flops 81, 82 and a NOR gate 83 the output of which is connected to the S(set) inputs of both flip flops. The Q outputs of flip-flops 81, 82 are connected to respective inputs of gate 83. The clock (C) input to flip flop 81 is connected via lead f to an output of FIG. 8 which rises to '1' synchronously with the rising edge of signal input waveform on lead e. The clock input of flip flop 82 is connected via lead c to an output of the sampling pulse generator 23 (FIG. 7) which rises to '1' synchronously with the rising edge of the input signal waveform on lead *a*. Thus the arrangement effectively compares the two signal input waveforms.

If it is first assumed that the leading (i.e. rising) edge of the waveform on lead *f* leads that on lead *c* (referred to as the 'phase advanced' state) and that flip flops 81, 82 are in the set (Q = '1') state, then flip flop 81 is reset (Q = '0') by the rising edge on lead *f*. Flip flop 82 is then reset by the rising edge on lead *c*. As soon as it does so, the two '0' inputs to gate 83 enable this gate and its '1' outputs sets each of the flip flops 81, 82 back to the set state (Q = '1') again. Thus a '1' pulse appears on the $\overline{Q}$ output of flip flop 81 having a duration (pulse width) equal to the period between the leading edges of the waveforms on leads *f* and *c*, and a '1' pulse of extremely short duration (the switching times of gate 83 and flip flop 82) appears on the $\overline{Q}$ output of flip flop 82 synchronous with the leading edge of the waveform appearing on lead *c*. Thus the width of the '1' pulse on the $\overline{Q}$ output (lead *s*) flip flop 81 is directly proportional to the lead phase difference between the two inputs on leads *f* and *c*. If it is now assumed that the leading edge of the signal waveform on lead *f* lags that on lead *c* (referred to as the 'phase retarded' state) and that flip flops 81 and 82 are in the set (Q = '1') state, then flip flop 82 is reset first followed by flip flop 81 whereupon, in the manner described above both flip flops are set again by gate 83. Thus the width of the '1' pulse on the $\overline{Q}$ output (lead *v*) of gate 82 is directly proportional to the lagging phase difference between the two inputs.

The $\overline{Q}$ outputs of flip flops 81 and 82 are respectively fed to the D and C inputs of flip flop 79, FIG. 10, via respective leads *s* and *v*. Summarising the operation of flip flops 81 and 82 (FIG. 11) a short '1' pulse appears on lead *v* at the end of a '1' pulse on lead *s* for the phase advanced state and vice versa for the phase retarded state. Thus flip-flop 79 is permanently set (Q = '1') during the phase advanced state and permanently reset (Q = '0') in the phase retarded state. The Q and $\overline{Q}$ outputs of flip-flop 79 are fed to respective inputs of two NOR gates 75 and 76, the other inputs of these gates being fed from the Q output (lead *p*) of flip flop 78. As explained previously, the signal on lead *p* is '1' if sampling occurs during the falling slope period and '0' at all other times; so gates 75 and 76 are inhibited if sampling occurs during the falling slope period. As a result, switches 46 and 47 FIG. 6 cannot operate during this period. In the phase advanced state, the Q and $\overline{Q}$ outputs of flip flop 79 are '1' and '0' respectively if sampling takes place other than during the falling slope with the result that the signal on lead *r* is '1' and switch 46 is operated to give a '0' at terminal 48 (FIG. 6). Thus, for the phase advanced state, switch 41 is operated if sampling occurs during the falling slope period to provide the sampled output of terminal 48 and if sampling occurs at any other time (i.e. if the phase lead is greater than that represented by the falling slope period) switch 46 holds terminal 48 at '0'. For the phase retarded state, gate 75 is enabled and operates switch 47 if sampling occurs other than during the falling slope period. Thus, a '1' appears on terminal 48 under this condition and the output characteristic of the phase comparator described with reference to FIGS. 6 to 11 is as shown in FIG. 5.

The output '1' signal on lead *t*, FIGS. 6 and 10, can be used if required as an indicator signal that the comparator is "out of lock" in a P.L.L. system; that is to say that sampling is not occurring during the falling slope period.

The various gates, delay flip-flops, switches and amplifiers shown in FIGS. 7 to 11 and used in a practical embodiment were commercially-available integrated circuit blocks as follows:

Quad NOR-gate, Motorola Type MC14001 64, 65, 66, 68, 69, 71, 72, 73, 74, 75, 76, 83, 11, 12

Dual D-type flip-flop Motorola Type MC14013 67, 77, 78, 79, 81, 82.

Quad Analogue Switch, Motorola Type MC14016 16, 41, 46, 47, 63.

Operational Amplifier, RCA Type CA3130.

The various resistance and capacitance values used were as follows:

| R1 - 1 kOhm   | C1 - 100 pF |
| R2 - 4.7 kOhm | C2 - 100 pF |
| R3 - 4.7 kOhm | C3 - 470 pF |
| R4 - 10 kOhm  | C4 - 22 pF  |
| R5 - 3.3 kOhm | C5 - 820 pF |
|               | C6 - 120 pF |

Although an embodiment of the invention has been described in which the comparator responds to the leading edges of the respective input signal waveforms, the invention is equally applicable to a comparator which responds to the trailing edges of the input waveforms. In this case, the two waveforms would need to have the same '1' to '0' (mark-space) ratio; otherwise phase errors could be introduced. Also, of course, the embodiments shown may be modified in a manner well known to those skilled in the art to respond to falling edges instead of rising edges of the input waveforms and to use different forms of gates and flip-flops from those shown in FIGS. 7 to 11.

What is claimed is:

1. A digital phase comparator for comparing the phase difference between first and second binary input signals, said comparator comprising a trapezoidal waveform generator having an input means for receiving said second signal, and an output means for producing in synchronism with said second input signal a third signal having a ramped leading edge of predetermined slope occupying less than one hundred eighty degrees of said third signal and a given duration upon each occurrence of a given edge of said second input signal;

a sampling switch having a control input means for receiving a signal in accordance with said first input signal and for operating said switch for a period less than said given duration upon each occurrence of a corresponding given edge of said first input signal, a signal input coupled to said generator output means, and an output means for providing sampled values of said third signal upon each operation of said switch;

a comparator output;

a sample holding circuit means coupled to said sampling switch and said comparator output for storing said sampled values between sampling instants and for providing an analog signal to said comparator output indicative of said sampled values; and a detector means having an input coupled to receive a signal in accordance with one of said input signals, and an output means for preventing said sample holding circuit for providing said analog signal to said comparator output and for providing to said comparator output a direct current signal having one of two different predetermined constant levels in accordance with whether the phase difference between said two input signals is increasing or decreasing respectively upon said sampling switch being operated during other than said ramped leading edge.

2. A digital phase comparator as claimed in claim 1, wherein said given edge of each input signal is the leading edge thereof.

3. A digital phase comparator as claimed in claim 1, wherein the direct current signals coincide with the respective end limit levels of the analog output signal.

4. A digital phase comparator as claimed in claim 1, further including a buffer amplifier coupled between said sample holding circuit and the output of the comparator.

5. A digital phase comparator as claimed in claim 1, further including a second sampling switch coupled between the sample holding circuit and the output of the comparator, and a second sample holding circuit coupled between the second sampling switch and said output.

* * * * *